United States Patent
Stefanov et al.

(10) Patent No.: US 10,411,004 B2
(45) Date of Patent: Sep. 10, 2019

(54) SEMICONDUCTOR DEVICE SUITABLE FOR ELECTROSTATIC DISCHARGE (ESD) PROTECTION

(71) Applicant: NXP USA, Inc., Austin, TX (US)

(72) Inventors: Evgueniy Nikolov Stefanov, Vieille Toulouse (FR); Patrice Besse, Tournefeuille (FR); Jean Philippe Laine, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/957,193

(22) Filed: Apr. 19, 2018

(65) Prior Publication Data
US 2018/0342496 A1    Nov. 29, 2018

(30) Foreign Application Priority Data
May 23, 2017 (EP) .................... 17305609

(51) Int. Cl.
| | |
|---|---|
| H01L 27/02 | (2006.01) |
| H01L 29/87 | (2006.01) |
| H01L 29/06 | (2006.01) |
| H01L 21/266 | (2006.01) |
| H01L 21/324 | (2006.01) |
| H01L 21/74 | (2006.01) |

(Continued)

(52) U.S. Cl.
CPC ........ *H01L 27/0248* (2013.01); *H01L 21/266* (2013.01); *H01L 21/324* (2013.01); *H01L 21/743* (2013.01); *H01L 21/761* (2013.01); *H01L 23/535* (2013.01); *H01L 27/0255* (2013.01); *H01L 27/0262* (2013.01); *H01L 29/0626* (2013.01); *H01L 29/0646* (2013.01); *H01L 29/87* (2013.01)

(58) Field of Classification Search
None
See application file for complete search history.

(56) References Cited

U.S. PATENT DOCUMENTS

| | | |
|---|---|---|
| 4,514,747 A | 4/1985 | Miyata et al. |
| 5,246,870 A | 9/1993 | Merchant |
| 5,300,448 A | 4/1994 | Merchant et al. |

(Continued)

FOREIGN PATENT DOCUMENTS

WO    2015075495 A1    5/2015

OTHER PUBLICATIONS

He et al. "Linearly graded doping drift region: a novel lateral voltage-sustaining layer used for improvement of RESURF LDMOS transistor performance", Semicond. Sci. & Technology, 17, (2002) 721-728.

*Primary Examiner* — Calvin Y Choi (57) ABSTRACT

Semiconductor device and methods for making the devices includes a buried layer of a first conductivity in a substrate in which a distance between two adjacent ends can be selected to achieve a desired breakdown voltage. A deep well having a first doping concentration of a second conductivity type is implanted in an epitaxial layer above the two adjacent ends of the buried layer. A patterned doped region is formed in the deep well and extending into the epitaxial layer above and separated a distance from the two adjacent ends of the buried lay. The patterned doped region has a second doping concentration of the second conductivity type that is greater than the first doping concentration.

20 Claims, 4 Drawing Sheets

(51) Int. Cl.
*H01L 21/761* (2006.01)
*H01L 23/535* (2006.01)

(56) References Cited

U.S. PATENT DOCUMENTS

| | | | |
|---|---|---|---|
| 5,767,547 | A | 6/1998 | Merchant et al. |
| 5,883,414 | A | 3/1999 | Ito |
| 6,376,289 | B1 | 4/2002 | Zingg |
| 2011/0176244 | A1 | 7/2011 | Gendron et al. |
| 2014/0061716 | A1 | 3/2014 | Zhan et al. |
| 2014/0147983 | A1 | 5/2014 | Gendron et al. |
| 2014/0225156 | A1 | 8/2014 | Zhan et al. |
| 2015/0102384 | A1 | 4/2015 | Zhan et al. |
| 2015/0270333 | A1* | 9/2015 | Yang .................. H01L 29/063 257/337 |
| 2015/0295082 | A1 | 10/2015 | Kim et al. |
| 2016/0005730 | A1 | 1/2016 | Zhan et al. |
| 2016/0300828 | A1* | 10/2016 | Laine ................. H01L 27/0259 |

\* cited by examiner

SEMICONDUCTOR DEVICE SUITABLE FOR ELECTROSTATIC DISCHARGE (ESD) PROTECTION

BACKGROUND

Field

This disclosure relates generally to integrated circuits, and more specifically, to semiconductor devices suitable for electrostatic discharge (ESD) protection.

Related Art

Electrostatic discharge (ESD) is a problem in the utilization, manufacturing and design of the semiconductor devices. The integrated circuits manufactured on the semiconductor device can be damaged when ESD events are received from other circuits coupled to the semiconductor device or from people or machinery and tools touching the semiconductor device. During an ESD event the integrated circuit may receive a charge which leads to relatively large currents during a relatively short period of time. As the result of the large current (until several amps during tens of nanoseconds), the voltage inside the IC increases. If the resulting voltage, current, power or energy exceed a maximum capability of the circuits then it may create irreparable damage to the integrated circuit.

Today most integrated circuits include ESD devices within ESD protection circuitries that are able to conduct the charge of an ESD event to, for example, the ground without causing irreparable damage to the integrated circuit. Such ESD protection circuits are typically arranged near the I/O pads of the integrated circuit and are configured to conduct the charge of the ESD event directly to the ground before the current may reach the vulnerable portions of the integrated circuit.

The accuracy of the breakdown voltage (BV) and its location within an ESD device impacts the reliability of the ESD device. Typically, the BV adjustment of an ESD device is achieved with the modulation of the lateral spacing between the n-doped and p-doped layers. This lateral location of the BV results in the greatest current density/flow during avalanche being located at the closest spacing between the n-doped and p-doped layers near the top surface of the device. This hot spot location prevents the ESD device from sustaining sufficient Gun stress and thus from providing sufficient protection. Therefore, a need exists for an ESD device which allows for the proper accuracy and location of the BV to allow for improved protection of an integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment of the present invention, an ESD device is formed having a vertical location of the breakdown area within a p-n junction. In this manner, current flows vertically downward, toward the substrate, from the p-n junction. This vertical location of the BV allows a finer adjustment of the BV than currently allowed by the lateral location of the BV. In one embodiment, by controlling a spacing between two adjacent openings in a mask used to form an N-type buried layer of the ESD device, the vertical BV for the resulting p-n junction can be accurately defined.

Figure 1:
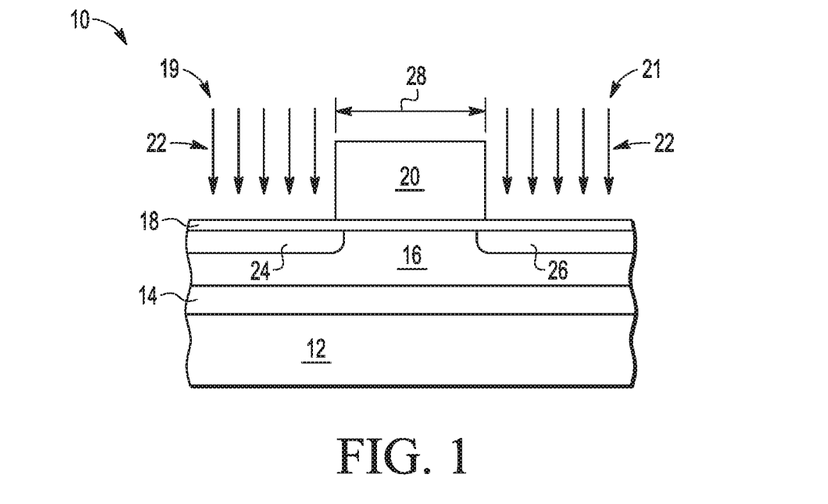
FIG. 1 illustrates, in cross-sectional form, a semiconductor device at a stage in processing, in accordance with one embodiment of the present invention.

FIG. 1 illustrates, in cross-sectional form, an ESD device 10 at a stage in processing. Device 10 includes a substrate 12, which can be any semiconductor material or combinations of materials, such as gallium arsenide, silicon germanium, silicon, monocrystalline silicon, the like, or combinations thereof. An insulator layer 14 is located over substrate 12. In one embodiment, insulator layer 14 is an oxide layer and may be referred to as buried oxide (BOX) layer 14 and may have a thickness of 300 nanometers. A P-type epitaxial silicon (P-epi) layer 16 is located over BOX layer 14. In one embodiment, layer 16 has a thickness of 1500 nanometers and a doping level of 2e15 atoms/cm$^3$. Therefore, device 10 corresponds to a semiconductor-on-insulator (SOI) device, with a semiconductor layer (silicon layer 26) over an insulator (BOX layer 14). An insulator layer 18 is located over P-epi layer 16. The thickness of layer 18 may be, for example, 15 nanometers. A patterned masking layer 20 is formed over layer 18 which has a portion 20 located between mask openings 19 and 21. Patterned masking layer 20 may be formed of photoresist. An implant 22 is performed using masking layer 20, in which the implant through openings 19 and 21 and layer 18 result in highly doped N-type implant regions 24 and 26, respectively, within P-epi layer 16, which correspond to portions of a highly doped N-type buried layer (NBL). The implants to form N-type regions 24 and 26 may include antimony, arsenic, or phosphorous. Note that width 28 of portion 20 defines a lateral distance by which region 26 is spaced from region 24 in P-epi layer 16. Therefore, by controlling width 28, the lateral distance between regions 24 and 26 is affected. After forming implants regions 24 and 26, patterned masking layer 20 is removed.

Figure 2:
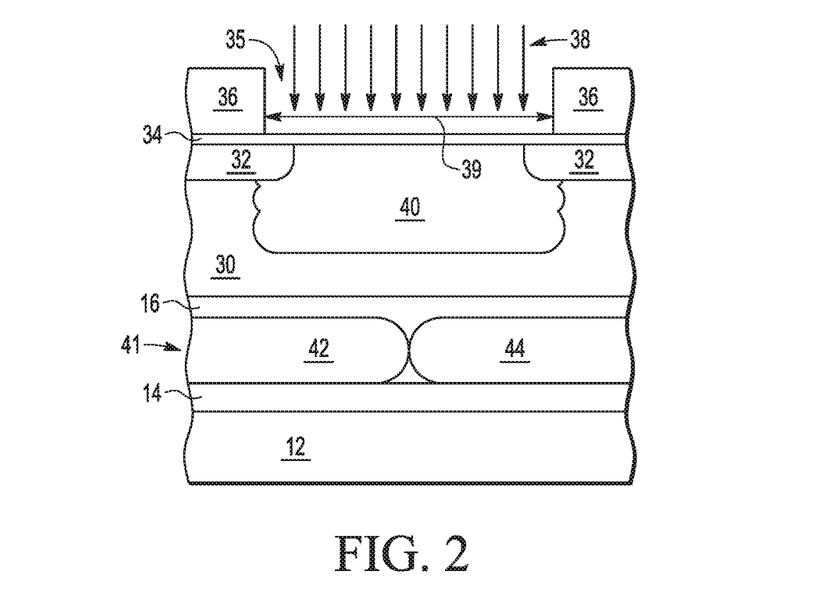
FIG. 2 illustrates, in cross-sectional form, the semiconductor device of FIG. 1 at a subsequent stage in processing, in accordance with one embodiment of the present invention.

FIG. 2 illustrates, in cross-sectional form, ESD device 10 at a subsequent stage in processing. A second P-type epitaxial (P-epi) layer 30 is formed over P-epi layer 16. P-epi layer 30 has a thickness in a range of about 3000 nm to 5000 nm. An implant anneal is performed to drive the dopants of regions 24 and 26 further into P-epi layer 16 to result in an NBL 41 having a first portion 42 corresponding to annealed region 24 and a second portion 44 corresponding to annealed region 26. The distance after anneal between portions 42 and 44 is less than a distance between portions 24 and 26. Each portion 42 and 44 has a first end and a second end, wherein the first ends have a smaller vertical (with respect to substrate 12) cross-section than the second ends. The first ends of portions 42 and 44 are adjacent each other, and the distance between them, after anneal, is dependent upon width 28 of portion 20 described above. Note that the NBL may also be referred to as a patterned buried layer. As will be discussed below, the spacing between portion 42 and 44 will determine the BV of device 10.

After the anneal to form NBL 41, shallow trench isolation (STI) regions 32 are formed within P-epi layer 30. An insulating layer 34 is formed over P-epi layer 30 and STI regions 32. A patterned masking layer 36 is then formed over P-epi layer 30 and insulating layer 34 having an opening 35 which exposes a region of P-epi layer 30 between STI regions 32. Note that width 39 of opening 35 is greater than width 28. Patterned masking layer 36 may be formed of photoresist. An implant 38 is performed using masking layer 36, in which the implant through opening 35 and layer 34 result in a medium doped P-type implant region 40, also referred to as Pwell 40 (or a deep well). Note that Pwell 40 has a higher dopant concentration that P-epi layer 30. In one embodiment, several different implants with high energy are used to perform implant 38. For example, implant 38 may include a boron implant at an energy within a range of 5 keV to 500 keV. After implant 38, patterned masking layer 36 is removed.

Figure 3:
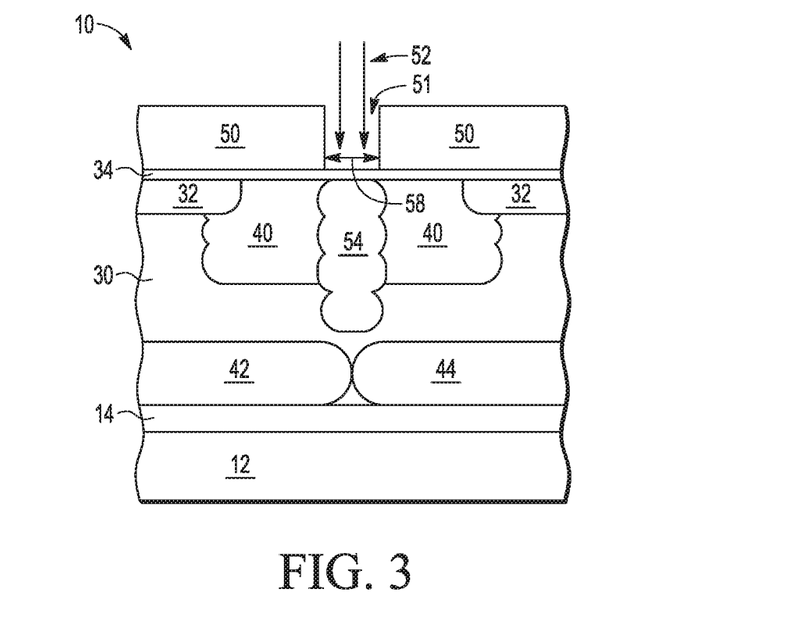
FIG. 3 illustrates, in cross-sectional form, the semiconductor device of FIG. 2 at a subsequent stage in processing, in accordance with one embodiment of the present invention.

FIG. 3 illustrates, in cross-sectional form, ESD device 10 at a subsequent stage in processing in which a vertical p-n junction is formed. A patterned masking layer 50 is formed over P-epi layer 30 and insulating layer 34 having an opening 51 which exposes a region of P-epi layer 30 within Pwell 40. Opening 51 is aligned with a center of previous portion 20 of patterned masking layer 28. Opening 51 has a width 58 which is smaller than widths 28 and 39. An implant 52 is performed using masking layer 50, in which the implant through opening 51 and layer 34 results in a highly doped P-type low voltage well (LVP) 54 (also referred to as a patterned doped region). LVP 54 extends deeper into P-epi 30 than Pwell 40 and is more heavily doped than Pwell 40. A bottom tip 53 of LVP 54 is located directly over the first ends of portions 42 and 44, and the proximity of the bottom tip of LVP 54 to portions 42 and 44 of NBL 41 ensures a deep p-n junction. After formation of LVP 54, an anneal is performed to drive the dopants into P-epi layer 30. Note that the combination of P-epi layers 16 and 30 are referred to as P-epi layer 31.

In one embodiment, several different implants with high energy are used to perform implant 52. For example, implant 52 may include a boron implant at an energy within a range of 5 keV to 1 MeV. This results in a vertical doping distribution of LVP 54 from the top of LVP 54 to the bottom tip of LVP 54. In one embodiment, LPV 54 is more heavily doped than Pwell 40, and Pwell 40 is more heavily doped than P-epi layer 30. In one example, the dopant concentration of P-epi layer 30 is 2e15 dopants/cm$^3$, the highest doping levels of the dopant distribution of LVP 54 is in a range of 5e17 and 8e17 dopants/cm$^3$, and the highest doping levels of the dopant distribution of Pwell 40 is about 4e17 dopants/cm$^3$.

Figure 4:
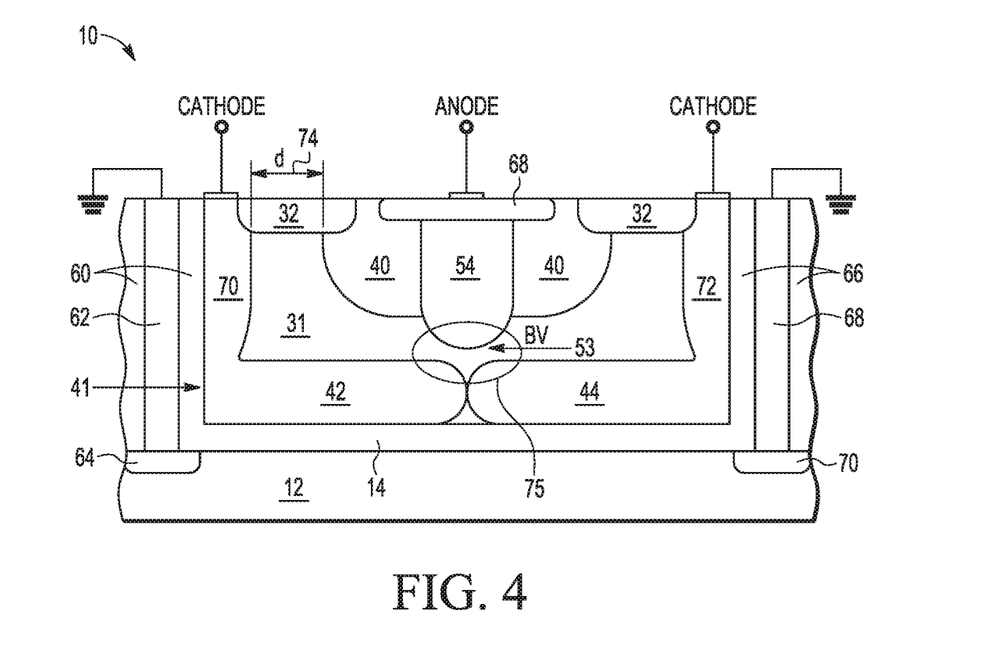
FIG. 4 illustrates, in cross-sectional form, a wider cross-section of the semiconductor device of FIG. 3 at a subsequent stage in processing.

FIG. 4 illustrates, in cross-sectional form, a wider cross-section of the ESD device 10 at a subsequent stage in processing. In FIG. 4, on either side of STI regions 32, deep N well (DPN) regions 70 and 72, deep trench isolation (DTI) regions 60 and 66, and contacts 62 and 68 are visible. DPN region 70 extends vertically from the top surface of P-epi layer 30 to NBL 41, contacting portion 42. Likewise, DPN region 72 extends vertically from the top surface of P-epi layer 30 to NBL 41, contacting portion 44. DPN regions 70 and 72 are located at the outer sides and under a portion of STI regions 32, such that STI regions 32 are located between DPN regions 70 and 72. Therefore, DPN regions 70 and 72 and portions 42 and 44 form an isolation structure around P-epi layer 31, Pwell 40, and LVP 54. Adjacent DPN 70 is DTI region 60 which provides an N-type polysilicon contact region 62 extending vertically from a top surface of DTI 60 to contact substrate 12 at a heavily doped N-type region 64 formed in substrate 12. A shallow heavily doped P-type region 68 (also referred to as a shallow doped layer) is formed in P-epi layer 31, in Pwell 40 and LPV 54, and extends less into P-epi layer 31 than Pwell 40 and LVP 54. P-type doped region 68 serves as an anode terminal of ESD device 10. DPN regions 70 and 72 serve as cathode terminals of ESD device 10. Therefore, device 10 includes a pair of diodes. Adjacent DPN 72 is DTI region 66 which provides an N-type polysilicon contact region 68 extending vertically from a top surface of DTI 66 to contact substrate 12 at a heavily doped N-type region 70 formed in substrate 12. Contact regions 62 and 68 provide a ground connection for substrate 12. DTI regions 60 and 66 laterally isolate p-n junction 75 and device 10 from neighboring devices.

Still referring to FIG. 4, p-n junction 75 corresponds to the location of the BV of device 10. (P-n junction 75 corresponds to the top p-n junction between portions 42, 44, and layer 31.) Distance (d) 74 between DPN 70 and Pwell 40 should be high enough to ensure maximum electric field in the bottom of the p-n junction between LVP 54 and NBL 41. The diode p-n junction 75 is formed by LVP 54 and NBL 42 and 44, at the point where portions 42 and 44 are closest to each other. As stated above, note that the bottom tip of LVP 54 is located directly over NBL portions 42 and 44 at the point where their first ends are closest to each other. The BV can be modulated and adjusted using different values for width 28 (described above in reference to FIG. 1) which is aligned to width 58 of the mask used to form LVP 54. With the BV location at p-n junction 75, the current density/flow during BV occurs vertically (with respect to substrate 12) from the p-n junction down through NBL 41 to DPN region 70.

With p-n junction 75 being located under LVP 54 (and under the location of opening 51 used to form LVP 54), a smaller ESD device can be formed while having the ability to adjust, with good precision and smaller dispersion, the BV of the device. This is due to the vertical location of the impact ionization in the bottom of the junction (at p-n junction 75) due to the vertical LVP doping distribution stacked over the spacing between portions 42 and 44. This vertical design may also allow ESD protection with reduced voltage overshoot during fast ESD events.

Many applications require ESD robustness of their input/output (I/O) pins. One type of ESD protection circuit includes a bi-directional Silicon Controlled Rectifier (SCR) coupled with a PNP transistor. Note that a SCR (or a thyristor) is formed when the base of a PNP transistor is coupled to the collector of an NPN transistor. In the event of an ESD event of a positive voltage on an I/O pad, such an ESD protection circuit can conduct large currents, thus protecting the IC. Furthermore, these SCR devices can be stacked to offer higher voltage protection. Typically, the spacing between the Pwell and DPN layers in the SCR, which form the base/collector junction, define the BV and triggering voltage of the ESD circuit. However, in current ESD protection circuits, the need to stack devices or to increase the spacing between the Pwell and DPN layers limits the opportunity to reduce the footprints with scaling-down device sizes. Furthermore, these current ESD devices tend to exhibit larger overvoltages and larger BV standard deviations.

Figure 5:
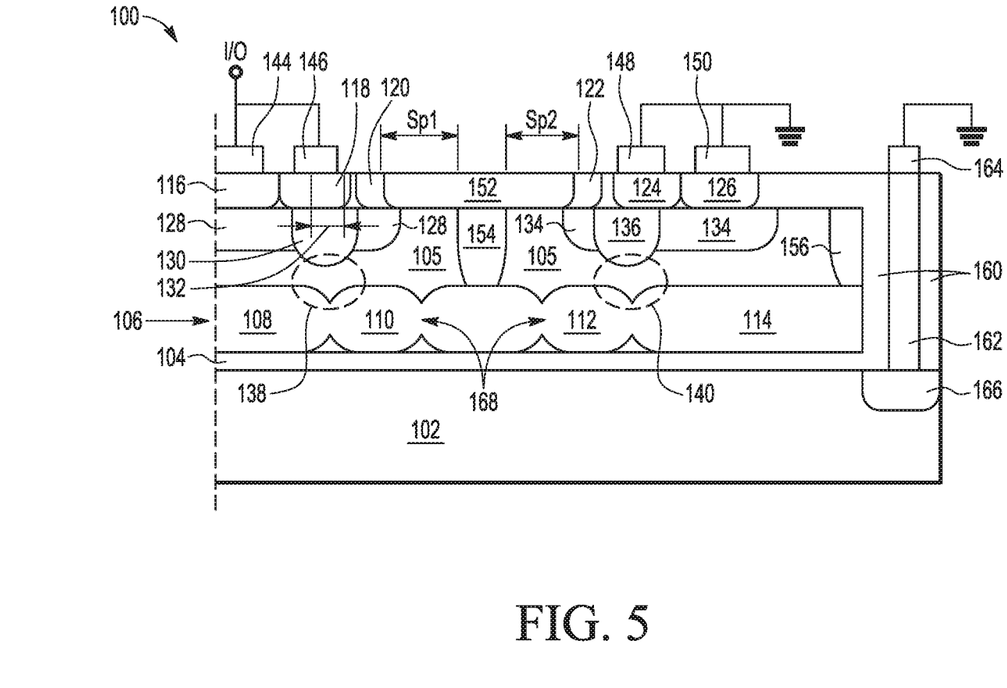
FIG. 5 illustrates, in cross-sectional form, a semiconductor device in accordance with an alternate embodiment of the present invention.

FIG. 5 illustrates, in cross-sectional form, a semiconductor device 100 of an integrated circuit in accordance with an alternate embodiment of the present invention. With the use of the vertical BV similar to that described above in references to FIGS. 1-4, a bi-directional mono-stack SCR ESD protection device can be formed which is coupled to an I/O pad of the integrated circuit. The I/O pad is configured to receive or provide an input/output signal. Device 100 includes a substrate 102 and an insulating layer 104 on substrate 102. Note that the descriptions provided above with respect to substrate 12 and insulating layer 14 apply to substrate 102 and insulating layer 104. A P-epi layer 105 is located on insulating layer 104. An NBL 106 is formed in P-epi layer 105, over insulating layer 104. DPN regions 154 and 156 are formed in P-epi layer 105 extending vertically from the top surface of P-epi layer 105 down to NBL 106. Adjacent DPN 156 is a DTI 160 which extends vertically down to contact substrate 102, and within DTI 160 is an N-type polysilicon contact region 162 extending vertically from a contact 164 located on a top surface of DTI 160 to contact substrate 102 at a heavily doped N-type region 166 formed in n-type substrate 102. Contact region 162 provides a ground connection for substrate 102. DTI regions 160 laterally isolate device 100 from neighboring devices.

Pwells 128 and 134, similar to Pwell 40, and LVPs 132 and 136, similar to LVP 54, are formed in P-epi layer 105. NBL 106 includes portions 108 and 110, similar to portions 42 and 44, and portions 112 and 114, similar to portions 42 and 44. Pwell 128 is formed over NBL 106, and LVP 130 is formed within the width of Pwell 128 and extends further into P-epi layer 105 than Pwell 128. Note that a doped p-n junction 138 is formed by LPV 130 and NBL 108 and 110, at the point where portions 108 and 110 are closest to each other. Pwell 134 is formed over NBL 106, and LVP 136 is formed within the width of Pwell 134 and extends further into P-epi layer 105 than Pwell 134. Note that a doped p-n junction 140 is formed by LVP 136 and NBL 112 and 114, at the point where portions 112 and 114 are closest to each other. The same descriptions and methods of formation described above with respect to Pwell 40, LVP 54, and NBL portions 42 and 44 also apply to Pwell 128, LVP 130, and NBL portions 108 and 110 as well as to Pwell 134, LVP 136, and NBL portions 112 and 114. For example, note that width 132 corresponds to the same width as width 28 of portion 20 of mask 22 used to form and achieve the proper spacings of NBL portions 42 and 44. In this manner, width 132 can be properly modulated to adjust the BV of p-n junction 138, and a similar mask width can be modulated to adjust the BV of p-n junction 140, as was described above in reference to width 29.

Still referring to FIG. 5, STI 152 is located in P-epi layer 105 between Pwells 128 and 134, and STI 153 between Pwell 134 and DTI 160. Note that Pwell 128 is formed partially under a first end of STI 152 and Pwell 134 is formed partially under a second end of STE 152. Pwell 134 is formed partially under a first end of STI 153. A second end of STI 153 is in contact with DTI 160. DPN 154 is located under STI 152 and DPN 153 is located under STI 153. A heavily doped P-type (P+) region 116 is formed in Pwell 128, outside of LVP 130, and provides a contact, via contact 144, to the I/O pad. A heavily doped N-type (N+) region 118 is formed in Pwell 128 and LVP 130 and provides a contact, via contact 146, to the I/O pad. Therefore, both contacts 144 and 146 are connected to the I/O pad, and N+ region 116 is immediately adjacent to and in contact with P+ region 118. A P+ region 120 is formed in Pwell 140, immediately adjacent the first end of STI 152. Thus, P+ region 120 is between N+ region 118 and STI 152. A P+ region 126 is formed in Pwell 134, outside of LVP 136, and provides a contact, via contact 150, to ground. An N+ region 124 is formed in Pwell 134 and LVP 136 and provides a contact, via contact 148, to ground. Therefore, both contacts 148 and 150 are connected to ground, and N+ region 124 is immediately adjacent to and in contact with P+ region 126. A P+ region 122 is formed in Pwell 134, immediately adjacent the second end of STI 153. Thus, P+ region 122 is between N+ region 124 and STI 152.

Note that p-n junction 138 corresponds to the location of the reverse mode BV and p-n junction 140 corresponds to the location of the forward mode BV. These junctions ensure vertical current flow (with respect to substrate 102) during BV and will suppress the overvoltage during fast current and voltage transients. Furthermore, with such a junction on both sides of DPN 154, a bi-directional ESD devices with symmetrical BV for forward and reverse blocking is achieved. Due to the LVPs and the NBL portions directly under each LPV, the location of the BV allows for a vertical current flow during avalanche. Also, the spacings Sp1 and Sp2 are relatively large (for example, greater than 3.9 microns) in order to further ensure that the location of avalanche is at the bottom of the p-n junctions to NBL layer 106 rather than laterally to the DPN, as in current SCR devices.

Figure 6:
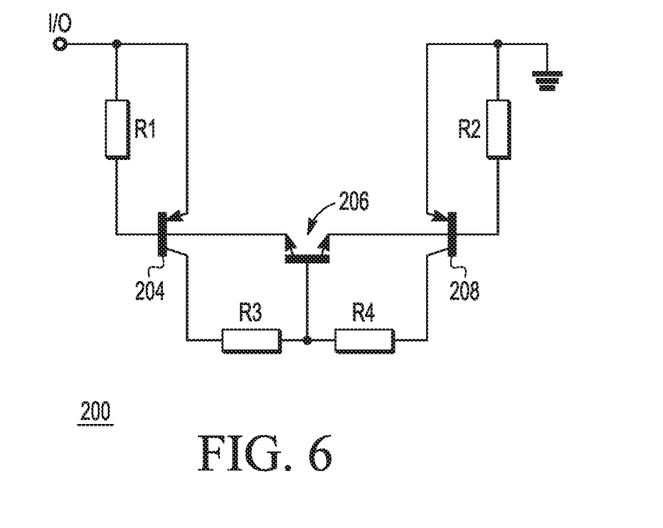
FIG. 6 illustrates, in schematic form, a circuit representation of the semiconductor device of FIG. 5.

FIG. 6 illustrates, in schematic form, a circuit representation 200 of the semiconductor device of FIG. 5. Circuit 200 includes an NPN transistor 204 formed by N+ region 118 (the emitter of transistor 204), P+ region 116 (the base of transistor 204), Pwell 128, LVP 130, P-epi 105, and NBL 106 (the collector of transistor 204), and an NPN transistor 208 formed by N+ region 124 (the emitter of transistor 208), P+ region 126 (the base of transistor 208), Pwell 134, LVP 136, P-epi layer 105, and NBL 106 (the collector of transistor 208). Resistances R1 and R2 represent the base resistances of vertical NPN transistors 204 and 208 in forward and reverse block mode, and should be as small as possible. Therefore, the spacing between the base and emitters is minimized to 0. Referring to FIG. 5, P+ region 116 abuts (i.e. is in physical contact with) N+ region 118, and P+ region 126 abuts (i.e. is in physical contact with) N+ region 124. P+ region 120 and P+ region 122 are floating and results in delaying triggering of the corresponding thyristor circuit. For the same reason, additional cuts (or separations) 168 along NBL 106 operate to increase the base resistances of a lateral PNP transistor 206 on both sides of DPN 154 (in which the base resistances are represented by R3 and R4). Note that, as seen in FIGS. 5 and 6, device 100/200 is not stacked onto another device (i.e. a mono-stack SCR ESD device), but still provides sufficient protection to sustain higher levels of Gun stress. In this manner, an improved ESD SCR protection circuit can be provided with a reduced footprint as compared to current ESD SCR protection circuits.

By now it should be appreciated that there has been provided an ESD device with a vertical location of the breakdown area within a p-n junction. In this manner, current flows vertically downward, toward the substrate, from the p-n junction. This vertical location of the BV allows a finer adjustment of the BV than currently allowed by the lateral location of the BV. In one embodiment, by controlling a spacing between two adjacent openings in a mask used to form an N-type buried layer of the ESD device, the vertical BV for the resulting p-n junction can be accurately defined. Furthermore, by forming a vertical location of the BV, an improved bi-directional mono-stack ESD SCR protection circuit can be formed.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, polarities and conductivity types may be reversed accordingly such that a vertical N-P junction or PNP transistor is formed rather than a vertical P-N junction or NPN transistor. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device includes a substrate; a patterned buried layer in the substrate having a first conductivity type, a first portion and a second portion, wherein the first and second portions each have a first end and a second end, the first ends having a smaller cross-section than the second ends, and the first ends with the smaller cross-section are adjacent to one another; a first deep well in the substrate having a second conductivity type and a first doping level, wherein the first deep well is separated from the patterned buried layer; and a patterned doped region in the first deep well directly over the first ends of the first and second portions, the patterned doped region having the second conductivity type and a second doping level that is greater than the first doping level. In one aspect of the one embodiment, the first deep well is separated from the patterned buried layer by an epitaxial layer having the second conductivity type. In another aspect, the patterned doped region extends into a separation between the patterned buried layer and the first deep well. In yet another aspect, a breakdown voltage of the device is determined by a distance between the first ends of the first and second portions of the patterned buried layer. In another aspect, the semiconductor device further includes a second deep well having the first conductivity type, the second deep well separated from the first deep well by a portion of the substrate and extending from the second end of the first portion of the patterned buried layer to a surface of the substrate; and a first electrical contact on the second deep well at the surface of the substrate. In a further aspect, the semiconductor device further includes a shallow doped layer at the surface of the substrate having the second conductivity type in the first deep well and in the patterned doped region; and a second electrical contact on the shallow doped layer at the surface of the substrate. In yet a further aspect, a third deep well having the first conductivity type, the third deep well separated from the first deep well by another portion of the substrate and extending from the second end of the second portion of the patterned buried layer to the surface of the substrate; and a third electrical contact on the third deep well at the surface of the substrate. In yet an even further aspect, the semiconductor device further includes a first deep trench isolation region adjacent the second deep well, the first deep trench isolation region connected to ground; and a second deep trench isolation region adjacent the third deep well, wherein the semiconductor device is a pair of diodes and the second deep trench isolation region is connected to ground. In another aspect of the above one embodiment, the semiconductor device further includes the patterned buried layer further including a third portion and a fourth portion, wherein the third and fourth portions each have a first end and a second end, the first ends having a smaller cross-section than the second ends, and the first ends with the smaller cross-section are adjacent to one another; a second deep well in the substrate having the second conductivity type and the first doping level, wherein the second deep well is separated from the patterned buried layer; and a patterned doped region in the second deep well directly over the first ends of the third and fourth portions of the patterned buried layer, the patterned doped region having the second conductivity type and the second doping level that is greater than the first doping level. In a further aspect, the semiconductor device further includes a first shallow doped region at the surface of the substrate having the first conductivity type in the first deep well and in the first patterned doped region; and an electrical contact on the first shallow doped region at the surface of the substrate. In yet a further aspect, the semiconductor device further includes a second shallow doped region at the surface of the substrate having the second conductivity type in the first deep well adjacent the patterned doped region, wherein the second shallow doped region abuts the first shallow doped region; and an electrical contact on the second shallow doped region at the surface of the substrate. In yet an even further aspect, the semiconductor device further includes a third shallow doped region at the surface of the substrate having the second conductivity type in the first deep well and partially in the patterned doped region, wherein the third shallow doped region is adjacent to and spaced apart from the first shallow doped region, and the electrical contacts on the first and second shallow doped regions are connected to ground. In yet an even further aspect, the semiconductor device further includes a fourth shallow doped region at the surface of the substrate having the first conductivity type in the second deep well and in the second patterned doped region; and an electrical contact on the fourth shallow doped region at the surface of the substrate. In yet a further aspect, the semiconductor device further includes a fifth shallow doped region at the surface of the substrate having the second conductivity type in the second deep well adjacent the second patterned doped region, wherein the fifth shallow doped region abuts the fourth shallow doped region; and an electrical contact on the fifth shallow doped region at the surface of the substrate. In yet an even further aspect, the semiconductor device further includes a sixth shallow doped region at the surface of the substrate having the second conductivity type in the second deep well and partially in the second patterned doped region, wherein the sixth shallow doped region is adjacent to and spaced apart from the fourth shallow doped region, the semiconductor device is a silicon controlled rectifier, and the electrical contacts on the fourth and fifth shallow doped regions are coupled to an input/output signal.

In another embodiment, a method of making a semiconductor device includes masking a section of a substrate with a first mask; implanting a buried layer of a first conductivity type in the substrate, wherein a first portion of the buried layer is separated a distance from a second portion of the buried layer due to the first mask; removing the first mask; annealing the buried layer, thereby decreasing the distance between the first and second portions of the buried layer; forming an epitaxial layer of a second conductivity type over the buried layer; masking a section of the substrate with a second mask; implanting a deep well in the epitaxial layer of material over the first and second portions of the buried layer, the deep well having the second conductivity type of a first doping concentration; removing the second mask; masking a section of the substrate with a third mask that includes an opening over the deep well and the first and second portions of the buried layer; and implanting a patterned doped region in the deep well over the first and second portions of the buried layer, wherein the patterned doped region has the second conductivity type of a second doping concentration that is greater than the first doping concentration and the patterned doped region extends through the deep well into the epitaxial layer but is separated from the first and second portions of the buried layer by a second distance. In one aspect of the above another embodiment, the method further includes implanting a second deep well having the first conductivity type, the second deep well separated from the deep well by a portion of the substrate and extending from one end of the first portion of the patterned buried layer to a surface of the substrate; forming an electrical contact on the second deep well at the surface of the substrate; implanting a shallow doped layer at the surface of the substrate having the second conductivity type in the first deep well and in the patterned doped region; forming an electrical contact on the shallow doped layer at the surface of the substrate; implanting a third deep well having the first conductivity type, the third deep well separated from the first deep well by another portion of the substrate and extending from one end of the second portion of the patterned buried layer to the surface of the substrate; forming an electrical contact on the third deep well at the surface of the substrate; forming a first deep trench isolation region adjacent the second deep well, the first deep trench isolation region connected to ground; and forming a second deep trench isolation region adjacent the third deep well, wherein the semiconductor device is a pair of diodes and the second deep trench isolation region is connected to ground. In another aspect, the method further includes implanting a third portion and a fourth portion of the buried layer when the first and second portions of the buried layer are implanted, wherein the third portion is separated a distance from the fourth portion of the buried layer due to the first mask; annealing the buried layer, thereby decreasing the distance between the third and fourth portions of the buried layer at the same time the distance between the first and second portions is being decreased; implanting a second deep well in the epitaxial layer of material over the third and fourth portions of the buried layer while the deep well is implanted, the second deep well having the second conductivity type of the first doping concentration; the masking the section of the substrate with the third mask includes an opening over the second deep well and the third and fourth portions of the buried layer; and implanting a second patterned doped region in the second deep well over the third and fourth portions of the buried layer, wherein the second patterned doped region extends through the second deep well into the epitaxial layer but is separated from the third and fourth portions of the buried layer by another distance. In a further aspect, the method further includes implanting a first shallow doped region at the surface of the substrate having the first conductivity type in the deep well and in the patterned doped region; forming an electrical contact on the first shallow doped region at the surface of the substrate; implanting a second shallow doped region at the surface of the substrate having the second conductivity type in the deep well adjacent the patterned doped region, wherein the second shallow doped region abuts the first shallow doped region; forming an electrical contact on the second shallow doped region at the surface of the substrate; implanting a third shallow doped region at the surface of the substrate having the second conductivity type in the deep well and partially in the patterned doped region, wherein the third shallow doped region is adjacent to and spaced apart from the first shallow doped region, and the electrical contacts on the first and second shallow doped regions are connected to ground. In yet a further aspect, the method further includes implanting a fourth shallow doped region at the surface of the substrate having the first conductivity type in the second deep well and in the second patterned doped region; forming an electrical contact on the fourth shallow doped region at the surface of the substrate; implanting a fifth shallow doped region at the surface of the substrate having the second conductivity type in the second deep well adjacent the second patterned doped region, wherein the fifth shallow doped region abuts the fourth shallow doped region; forming an electrical contact on the fifth shallow doped region at the surface of the substrate; implanting a sixth shallow doped region at the surface of the substrate having the second conductivity type in the second deep well and partially in the second patterned doped region, wherein the sixth shallow doped region is adjacent to and spaced apart from the fourth shallow doped region, wherein the semiconductor device is a silicon controlled rectifier and the electrical contacts on the fourth and fifth shallow doped regions are coupled to an input/output signal.

The invention claimed is:
1. A semiconductor device, comprising:
  a substrate;
  a patterned buried layer in the substrate having a first conductivity type, a first portion and a second portion wherein the first and second portions each have a first end and a second end, the first ends having a smaller cross-section than the second ends, and the first ends with the smaller cross-section are adjacent to one another;

a first deep well in the substrate having a second conductivity type and a first doping level, wherein the first deep well is separated from the patterned buried layer;
a patterned doped region in the first deep well directly over the first ends of the first and second portions, the patterned doped region having the second conductivity type and a second doping level that is greater than the first doping level, wherein the patterned doped region extends into a separation between the patterned buried layer and the first deep well such that the patterned doped region extends deeper into the substrate as compared to the first deep well.

2. The semiconductor device of claim 1, wherein the first deep well is separated from the patterned buried layer by an epitaxial layer having the second conductivity type.

3. The semiconductor device of claim 1, wherein:
the patterned doped region is narrower than the first deep well such a width of the patterned doped region at a surface of the substrate is smaller than a width of the first deep well at the surface of the substrate.

4. The semiconductor device of claim 1, wherein:
a breakdown voltage of the device is determined by a distance between the first ends of the first and second portions of the patterned buried layer.

5. The semiconductor device of claim 1, further comprising:
a second deep well having the first conductivity type, the second deep well separated from the first deep well by a portion of the substrate and extending from the second end of the first portion of the patterned buried layer to a surface of the substrate;
a first electrical contact on the second deep well at the surface of the substrate.

6. The semiconductor device of claim 5, further comprising:
a shallow doped layer at the surface of the substrate having the second conductivity type in the first deep well and in the patterned doped region; and
a second electrical contact on the shallow doped layer at the surface of the substrate.

7. The semiconductor device of claim 6 wherein:
a third deep well having the first conductivity type, the third deep well separated from the first deep well by another portion of the substrate and extending from the second end of the second portion of the patterned buried layer to the surface of the substrate; and
a third electrical contact on the third deep well at the surface of the substrate.

8. The semiconductor device of claim 7, further comprising:
a first deep trench isolation region adjacent the second deep well, the first deep trench isolation region connected to ground; and
a second deep trench isolation region adjacent the third deep well, wherein the semiconductor device is a pair of diodes and the second deep trench isolation region is connected to ground.

9. The semiconductor device of claim 1, further comprising:
the patterned buried layer further including a third portion and a fourth portion, wherein the third and fourth portions each have a first end and a second end, the first ends having a smaller cross-section than the second ends, and the first ends with the smaller cross-section are adjacent to one another;

a second deep well in the substrate having the second conductivity type and the first doping level, wherein the second deep well is separated from the patterned buried layer;
a patterned doped region in the second deep well directly over the first ends of the third and fourth portions of the patterned buried layer, the patterned doped region having the second conductivity type and the second doping level that is greater than the first doping level.

10. The semiconductor device of claim 9, further comprising:
a first shallow doped region at the surface of the substrate having the first conductivity type in the first deep and in the first patterned doped; and
an electrical contact on the first shallow doped region at the surface of the substrate.

11. The semiconductor device of claim 10, further comprising:
a second shallow doped region at the surface of the substrate having the second conductivity type in the first deep well adjacent the patterned doped region, wherein the second shallow doped region abuts the first shallow doped region, and
an electrical contact on the second shallow doped region at the surface of the substrate.

12. A method of making a semiconductor device, comprising:
masking a section of a substrate with a first mask;
implanting a buried layer of a first conductivity type in the substrate, wherein a first portion of the buried layer is separated a distance from a second portion of the buried layer due to the first mask;
removing the first mask;
annealing the buried layer, thereby decreasing the distance between the first and second of the buried layer;
forming an epitaxial layer of a second conductivity type over the buried layer;
masking a section of the substrate with a second mask;
implanting a deep well in the epitaxial layer of material over the first and second portions of the buried layer, the deep well having the second conductivity type of a first doping concentration;
removing the second mask;
masking a section of the substrate with a third mask that includes an opening over the deep well and the first and second portions of the buried layer; and
implanting a patterned doped region in the deep well over the first and second portions of the buried layer, wherein the patterned doped region has the second conductivity type of a second doping concentration that is greater than the first doping concentration and the patterned doped region extends entirely through the deep well into the epitaxial layer such that the patterned doped region extends deeper into the substrate than the deep well but is separated from the first and second portions of the buried layer by a second distance.

13. The method of claim 12, further comprising:
implanting a second deep well having the first conductivity type, the second deep well separated from the deep well by a portion of the substrate and extending from one end of the first portion of the patterned buried layer to a surface of the substrate;
forming an electrical contact on the second deep well at the surface of the substrate;
implanting a shallow doped layer at the surface of the substrate having the second conductivity type in the first deep well and in the patterned doped region;

forming an electrical contact on the shallow doped layer at the surface of the substrate;

implanting a third deep well having the first conductivity type, the third deep well separated from the first deep well by another portion of the substrate and extending from one end of the second portion of the patterned buried layer to the surface of the substrate;

forming an electrical contact on the third deep well at the surface of the substrate;

forming a first deep trench isolation region adjacent the second deep well, the first deep trench isolation region connected to ground; and forming a second deep trench isolation region adjacent the third deep well, wherein the semiconductor device is a pair of diodes and the second deep trench isolation region is connected to ground.

14. The method of claim 12, further comprising:

implanting a third portion and a fourth portion of the buried layer when the first and second of the buried layer are implanted, wherein the third portion is separated a distance from the fourth portion of the buried due to the first mask;

annealing the buried layer, thereby decreasing the distance between the third and fourth portions of the buried layer at the same time the distance between the first and second portions is being decreased;

implanting a second deep well in the epitaxial layer of material over the third and fourth portions of the buried while the deep well is implanted, the second deep well having the second conductivity type of the first doping concentration;

the masking the section of the substrate with the third mask includes an opening over the second deep well and the third and fourth portions of the buried layer; and implanting a second patterned doped region in the second deep well over the third and fourth portions of the buried layer, wherein the second patterned doped region extends through the second deep well into the epitaxial layer but is separated from the third and fourth portions of the buried layer by another distance.

15. The method of claim 14, further comprising:

implanting a first shallow doped at the surface of the substrate having the first conductivity type in the deep well and in the patterned doped region;

forming an electrical contact on the first shallow doped region at the surface of the substrate;

implanting a second shallow doped at the surface of the having the second conductivity type in the deep well adjacent the patterned doped region, wherein the second shallow doped region abuts the first shallow doped region;

forming an electrical contact on the second shallow doped at the surface of the substrate;

implanting a third shallow doped region at the surface of the substrate having the second conductivity type in the deep well and partially in the patterned doped region, wherein the third shallow doped region is adjacent to and spaced apart from the first shallow doped region, and the electrical contacts on the first and second shallow doped regions are connected to ground.

16. The method of claim 15, further comprising:

implanting a fourth shallow doped region at the surface of the substrate having the first conductivity type in the second deep well and in the second patterned doped region;

forming an electrical contact on the fourth shallow doped region at the surface of the substrate;

implanting a fifth shallow doped region at the surface of the substrate having the second conductivity type in the second deep well adjacent the second patterned doped region, wherein the fifth shallow doped region abuts the fourth shallow doped region;

forming an electrical contact on the fifth shallow doped region at the surface of the substrate;

implanting a sixth shallow doped region at the surface of the substrate having the second conductivity type in the second deep well and partially in the second patterned doped region, wherein the sixth shallow doped region is adjacent to and spaced apart from the fourth shallow doped region, wherein the semiconductor device is a silicon controlled rectifier and the electrical contacts on the fourth and fifth shallow doped regions are coupled to an input/output signal.

17. The semiconductor device of claim 11, further comprising:

a third shallow doped region at the surface of the substrate having the second conductivity type in the first deep well and partially in the patterned doped region, wherein the third shallow doped region is adjacent to and spaced apart from the first shallow doped region, and the electrical contacts on the first and second shallow doped regions are connected to ground.

18. The semiconductor device of claim 17, further comprising:

a fourth shallow doped region at the surface of the substrate having the first conductivity type in the second deep well and in the second patterned doped region; and an electrical contact on the fourth shallow doped region at the surface of the substrate.

19. The semiconductor device of claim 18, further comprising:

a fifth shallow doped region at the surface of the substrate having the second conductivity type in the second deep well adjacent the second patterned doped region, wherein the fifth shallow doped region abuts the fourth shallow doped region; and an electrical contact on the fifth shallow doped region at the surface of the substrate.

20. The semiconductor device of claim 19, further comprising:

a sixth shallow doped region at the surface of the substrate having the second conductivity type in the second deep well and partially in the second patterned doped region, wherein the sixth shallow doped region is adjacent to and spaced apart from the fourth shallow doped region, the semiconductor device is a silicon controlled rectifier, and the electrical contacts on the fourth and fifth shallow doped regions are coupled to an input/output signal.

* * * * *